United States Patent

Nicolet et al.

Patent Number: 5,997,949
Date of Patent: *Dec. 7, 1999

[54] SYNTHESIS OF W-SI-N FILMS BY CHEMICAL VAPOR DEPOSITION USING $WF_6$, $SIH_4$ AND $NH_3$

[75] Inventors: Marc-A. Nicolet, Pasadena, Calif.; Roland Madar, Eybens; Claude Bernard, Brie et Angonnes, both of France; James G. Fleming, Albuquerque, N.Mex.; Elizabeth Lynn Roherty-Osmun, Albuquerque, N.Mex.; Paul M. Smith, Albuquerque, N.Mex.; Jonathan S. Custer, Albuquerque, N.Mex.; Ronald V. Jones, Albuquerque, N.Mex.

[73] Assignees: California Institute of Technology, Pasadena, Calif.; Sandia Corporation, Albuquerque, N.Mex.

[*] Notice: This patent is subject to a terminal disclaimer.

[21] Appl. No.: 08/717,316

[22] Filed: Sep. 20, 1996

Related U.S. Application Data

[60] Provisional application No. 60/004,128, Sep. 22, 1995.

[51] Int. Cl.$^6$ .................................................. C23C 16/08
[52] U.S. Cl. ................................. 427/255.2; 427/255.1; 427/255; 427/314
[58] Field of Search ............................ 427/255.2, 255.1, 427/255, 248.1, 314

[56] References Cited

PUBLICATIONS

Dutron et al, "Morphology and thermal stability of M–Si–N(M=Re, W, Ta) for microelectronics", J. Phys. IV, 5(C5, Chemical Vapour Deposition, vol. 2), C5/1141–C5/1148, 1995 No month data is available.

Pierson, "Handbook Of Chemical Vapor Deposition (CVD), Principles, Technology and Applications", Noyes Publications, 1992, pp. 61, 148–150 and 247–248, No month data is available.

*Sputtered Ta–Si–N Diffusion Barriers in Cu Metallizations for Si,* Kolawa et al., IEEE Electron Device Letters, vol. 12, No. 6 (jun. 1991) pp. 321–323.

*Silicon Schottky Barriers and p–n Junctions with Highly Stable Aluminum Contact Metalization,* Halperin et al., IEEE Electron Device Letters, vol. 12, No. 6 (jun. 1991), pp. 309–311.

*Primary Examiner*—Roy V. King
*Attorney, Agent, or Firm*—Blakely, Sokoloff, Taylor & Zafman LLP

[57] ABSTRACT

The present invention relates to the forming of amorphous or near-amorphous, ternary films of W-Si-N on substrates by chemical vapor deposition of $WF_6$, $SiH_4$ and $NH_3$ and a carrier gas. The present invention method will allow the conformal forming of amorphous or near-amorphous, ternary films of W-Si-N on patterned non-planar substrates at temperatures at or below about 450° C., by chemical vapor deposition of $WF_6$, $SiH_4$ and $NH_3$ and a carrier gas. A typical temperature range for the formation of the films is between 473° K. and 773° K., while the reactor pressure can be varied between 0.1 to 50 Torr. The composition of the deposited films is adjusted by varying the flow ratios of the reactive gases.

15 Claims, 1 Drawing Sheet

SYNTHESIS OF W-SI-N FILMS BY CHEMICAL VAPOR DEPOSITION USING $WF_6$, $SIH_4$ AND $NH_3$

CROSS-REFERENCE TO RELATED APPLICATION

This application claims benefit of U.S. Provisional Application Ser. No. 60/004,128 filed Sep. 22, 1995.

BACKGROUND OF THE INVENTION

1. Field of the Invention

The present invention relates to the forming of amorphous or near-amorphous, ternary films of W-Si-N on substrates at temperatures at or below about 450° C., by chemical vapor deposition of $WF_6$, $SiH_4$ and $NH_3$ and a carrier gas.

2. Description of Related Art

Experiments have established that films of amorphous or near-amorphous structure and metallic conductivity of a ternary composition W-Si-N can be synthesized by sputtering of a $W_5Si_3$ target with argon that contains an admixture of nitrogen. As discussed by L. E. Halperin, et al., in "Silicon Schottky Barriers and p-n Junctions with Highly Stable Aluminum Contact Metallization", IEEE Electron Device Letters Vol. 12, No. 6, p. 309–311 (1991) and by E. Kolawa et al., in "Sputtered Ta-Si-N Diffusion Barriers in Cu Metallizations for Si", IEEE Electron Device Letters, Vol. 12, No. 6, p. 321–323 (1991), these films are excellent diffusion barriers for copper and other metals used as contact and interconnection materials in devices and integrated circuits of silicon and other semiconductors.

A drawback of the reactive sputter-deposition is the inadequate conformality of the film when it is deposited on a finely patterned non-planar substrate, as are typically encountered in advanced integrated circuits. Conformality is an essential requirement for diffusion barriers.

BRIEF SUMMARY OF THE INVENTION

The present invention relates to the forming of amorphous or near-amorphous, ternary films of W-Si-N on substrates by chemical vapor deposition of $WF_6$, $SiH_4$ and $NH_3$ and a carrier gas. The present invention method will allow the conformal forming of amorphous or near-amorphous, ternary films of W-Si-N on patterned non-planar substrates at temperatures at or below about 450° C. by chemical vapor deposition of $WF_6$, $SiH_4$ and $NH_3$ and a carrier gas.

DETAILED DESCRIPTION OF THE INVENTION

Figure 1:
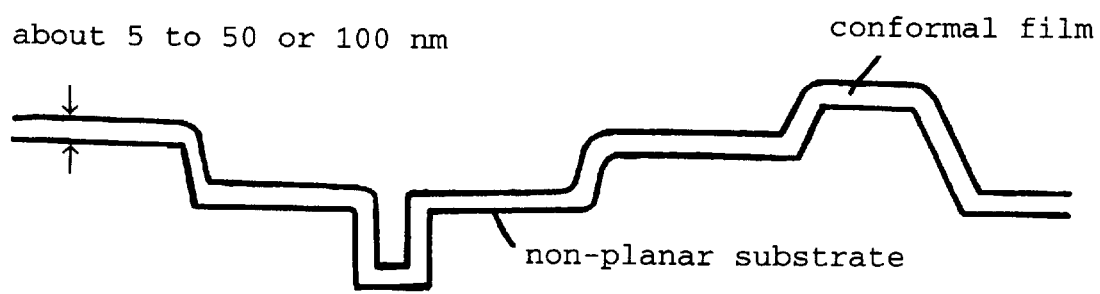
FIG. 1 is a cross-sectional view of the conformality of a thin, amorphous metallic film deposited by chemical vapor deposition on a substrate with non-planar surface morphology, as typically encountered in microelectronic applications.

The deposition of films by reaction of gaseous species ("chemical vapor deposition") can produce highly conformal films. Experiments performed at the Institut National Polytechnique de Grenoble (INPG) indicate that electrically conducting films of amorphous or near-amorphous structure of a ternary composition W-Si-N can also be obtained by chemical vapor deposition and that these films are highly conformal. FIG. 1 illustrates a cross-sectional view of the conformality of a thin amorphous metallic film deposited by chemical vapor deposition on a substrate with non-planar surface morphology as typically encountered in microelectronic applications. In the film illustrated, the thickness may range from about 5 to 50 or 5 to 100 nanometers, thinner films or thicker films are also useful, such as in micromachining and anticorrosion coatings.

The present invention achieves this result by the chemical vapor deposition of W-Si-N using $WF_6$, $SiH_4$ and $NH_3$ and argon as the carrier gas. One important advantage of this process is that it does not use chlorine-containing species. Because chlorine residues in the film are corrosive, chlorine-based species like $WCl_6$ are undesirable precursors for chemical vapor deposition of films. Moreover, $WF_6$ is a commercially available gas which can be handled using classical techniques while tungsten chlorides are solids at room temperature and need sophisticated equipment to bring their vapor to the point of use. Another important advantage is that the synthesis of the film with $WF_6$ takes place at temperatures of about 450° C. or less. With $WCl_6$, 600° C. is required. At this temperature, the deposited film becomes a two-phase mixture of W grains in a silicon nitride matrix rather than the desired film of amorphous or near-amorphous structure and metallic conductivity of a ternary composition W-Si-N.

A exemplary procedure is as follows: High purity $WF_6$, $NH_3$, $SiH_4$ are used together with an inert carrier gas such as argon or helium. Their flows are controlled by mass flow controllers. The gases are mixed in a manifold before introduction in the reactor. A low pressure cold wall reactor is used to avoid, as much as possible, homogeneous reactions in the gas phase. The gases are directed towards the heated substrate through a showerhead. A typical temperature range is between 473°K. and 773°K., while the reactor pressure can be varied between 0.1 to 50 Torr. The composition of the deposited films is adjusted by varying the flow ratios of the reactive gases. The substrate temperature is kept as low as possible to maintain the deposit in an amorphous state.

Modifications and variations of the embodiments described above may be made by those skilled in the art while remaining within the true scope and spirit of this invention. Thus, although the present invention has been described in terms of certain preferred embodiments, other embodiments that will be apparent to those of ordinary skill in the art are also within the scope of this invention. Accordingly, the scope of the invention is intended to be defined only by the claims which follow.

What is claimed is:

1. A method of forming a ternary metallic film on a substrate, comprising the steps of:
    (a) mixing gaseous tungsten hexafluoride, gaseous ammonia and a gaseous compound of silicon and hydrogen and heating the substrate; and,
    (b) directing the gas mixture to the surface of the heated substrate to deposit a film of a W-Si-N compound with a predetermined composition.

2. The method of claim 1 wherein step (a), the substrate is heated to a temperature in the temperature range of approximately 473° K. to 773° K.

3. The method of claim 1 wherein step (a) comprises the step of mixing gaseous tungsten hexafluoride, gaseous ammonia and a gaseous compound of silicon and hydrogen with an inert carrier gas.

4. The method of claim 3 wherein the inert gas is selected from the group consisting of argon and helium.

5. The method of claim 1 wherein step (b) is performed in a low pressure cold wall reactor.

6. The method of claim 5 wherein the reactor pressure is in the range of between 0.1 to 50 torr.

7. The method of claim 1 wherein in step (b), the substrate is maintained at a temperature of not more than approximately 450° C.

8. The method of claim 1 wherein in step (b), the substrate is a non-planar substrate.

9. The method of claim 1 wherein step (b) comprises the step of directing the gas mixture to the surface of the heated substrate to deposit a thin, conformal film of a W-Si-N compound between 5 to 100 nanometers thick.

10. The method of claim 1 wherein step (b) comprises the step of directing the gas mixture to the surface of the heated substrate to deposit a thin, conformal film of an amorphous W-Si-N compound.

11. A method of conformally forming a ternary metallic film on a substrate, comprising the steps of:
(a) mixing gaseous tungsten hexafluoride, gaseous ammonia, a gaseous compound of silicon and hydrogen and an inert gas selected from the group consisting of argon and helium, and heating the substrate to a temperature in the temperature range of 473° K. to 773° K.; and, (b) directing the gas mixture to the surface of the heated substrate in a pressure range of between 0.1 to 50 torr to deposit a thin, conformal film of a W-Si-N compound with a predetermined composition.

12. The method of claim 11 wherein in step (b), the substrate is maintained at a temperature of not more than approximately 450° C.

13. The method of claim 11 wherein in step (b), the substrate is a non-planar substrate.

14. The method of claim 11 wherein in step (b) comprises the step of directing the gas mixture to the surface of the heated substrate to deposit a thin, conformal film of a W-Si-N compound between 5 to 100 nanometers thick.

15. The method of claim 11 wherein step (b) comprises the step of directing the gas mixture to the surface of the heated substrate to deposit a thin, conformal film of an amorphous W-Si-N compound.

* * * * *